(12) United States Patent
Song et al.

(10) Patent No.: US 8,598,011 B2
(45) Date of Patent: Dec. 3, 2013

(54) RESISTIVE MEMORY DEVICE AND METHOD FOR FABRICATING THE SAME

(75) Inventors: Seok-Pyo Song, Gyeonggi-do (KR); Yu-Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 131 days.

(21) Appl. No.: 12/971,583

(22) Filed: Dec. 17, 2010

(65) Prior Publication Data

US 2011/0147694 A1 Jun. 23, 2011

(30) Foreign Application Priority Data

Dec. 18, 2009 (KR) .................. 10-2009-0127447

(51) Int. Cl.
 *H01L 21/20* (2006.01)
 *H01L 47/00* (2006.01)
 *H01L 21/44* (2006.01)

(52) U.S. Cl.
 USPC ........... 438/385; 257/4; 257/E21.52; 438/672

(58) Field of Classification Search
 USPC ........... 257/2–5; 438/382, 385, 397, 399, 672
 See application file for complete search history.

(56) References Cited

U.S. PATENT DOCUMENTS

| | | | |
|---|---|---|---|
| 2004/0202041 A1* | 10/2004 | Hidenori | 365/233 |
| 2006/0097238 A1* | 5/2006 | Breuil et al. | 257/4 |
| 2006/0110900 A1* | 5/2006 | Youn et al. | 438/592 |
| 2009/0001341 A1* | 1/2009 | Breitwisch et al. | 257/4 |
| 2009/0057640 A1* | 3/2009 | Lin et al. | 257/3 |
| 2009/0085025 A1* | 4/2009 | Arai et al. | 257/4 |
| 2009/0257271 A1* | 10/2009 | Noshiro | 365/148 |
| 2010/0110758 A1* | 5/2010 | Li et al. | 365/148 |

FOREIGN PATENT DOCUMENTS

| | | |
|---|---|---|
| JP | 2003-031705 | 1/2003 |
| JP | 2005-252284 | 9/2005 |
| JP | 2008-193107 | 8/2008 |
| KR | 1020080008234 | 1/2008 |

OTHER PUBLICATIONS

Notice of Allowance issued from Korean Intellectual Property Office on Aug. 26, 2011.

Notice of Preliminary Rejection issued from Korean Intellectual Property Office on Mar. 8, 2011.

\* cited by examiner

*Primary Examiner* — Daniel Luke
*Assistant Examiner* — Khaja Ahmad
(74) *Attorney, Agent, or Firm* — IP & T Group LLP

(57) ABSTRACT

A resistive memory device includes a plurality of resistive units, each resistive unit including: a lower electrode formed over a substrate; a resistive layer formed over the lower electrode; and an upper electrode formed over the resistive layer, wherein edge parts of the lower and upper electrodes, which come in contact with the resistive layer, is formed with a rounding shape.

9 Claims, 4 Drawing Sheets

RESISTIVE MEMORY DEVICE AND METHOD FOR FABRICATING THE SAME

CROSS-REFERENCE TO RELATED APPLICATIONS

The present invention claims priority of Korean patent application number 10-2009-0127447, filed on Dec. 18, 2009, which is incorporated by reference in its entirety.

BACKGROUND OF THE INVENTION

The present invention relates to a resistive memory device and a method for fabricating the same, and more particularly, to a resistive memory device which uses resistance change, such as a resistive random access memory (ReRAM) device, and a method for fabricating the same.

Recently, researches on next-generation memory device, which can replace Dynamic Random Access Memory (DRAM) and flash memory, are actively being conducted. One of such next-generation memory device is a resistive memory device that uses a resistive layer. The resistive layer includes a material of which resistance rapidly changes according to the applied bias and a switching is performed between two or more different resistive states.

FIG. 1 illustrates a cross-sectional view of a typical resistive memory device.

Referring to FIG. 1, the typical resistive memory device includes a substrate 10 which has a predetermined structure formed therein, a first insulation layer 11 formed over the substrate 10, and a first contact plug 12 which passes through the first insulation layer 11 and is connected with the substrate 10.

Subsequently, a lower electrode 13, a resistive layer 14, and an upper electrode 15 are sequentially formed over the first insulation layer 11 and the first contact plug 12. Then, a resistive unit of a stack structure is formed by etching the lower electrode 13, the resistive layer 14, and the upper electrode 15.

Subsequently, after a second insulation layer 16 is formed over a result structure including the resistive unit, a second contact plug 12 is formed by passing through the second insulation layer 16 to be connected with the upper electrode 15.

The switching mechanism of the resistive memory device having the above-described structure will be briefly described herein.

When a bias is applied to the lower and upper electrodes 13 and 15, conductive filaments may be generated through a rearrangement of oxygen vacancies in the resistive layer 14 or the oxygen vacancies are removed and, as a result, the conductive filaments generated before are removed based on the applied bias. The resistive layer 14 represents the two resistance states distinguished by the generation or removal of the conductive filaments. In other words, when the conductive filaments is generated, the resistance changing device represents a low resistance state, and when the conductive filaments are removed, the resistance changing device represents a high resistance state. Herein, an operation of generating the conductive filaments in the resistive layer 14 and representing the low resistance state is called a set operation. Conversely, an operation of removing the conductive filaments in the resistive layer 14 and representing the high resistance state is called a reset operation.

However, in the conventional resistive memory device, concentration degrees of electric fields between a core part and an edge part of the resistive unit are different according to a profile of the lower and upper electrodes 13 and 15. As a result, distribution regarding switching characteristics of the resistive unit is degraded.

As described above, when the resistive unit is formed by etching the lower electrode 13, the resistive layer 14, and the upper electrode 15, an edge part of the lower and upper electrodes 13 and 15, which comes in contact with the resistive layer 14, has a profile of a sharp-pointed shape ① as shown in FIG. 1.

Accordingly, since the electric fields are concentrated in the edge part of the lower and upper electrodes 13 and 15, the edge part switches earlier than the core part. As a result, distribution of a sensing current are not uniform in the resistive unit, and the switching characteristic of the resistive unit is degraded. Further, a leakage current may occur at the edge part of the resistive unit, and a sensing margin becomes narrower since an on/off ratio of a selection element is deteriorated.

SUMMARY OF THE INVENTION

Embodiments of the present invention are directed to providing a resistive memory device and a method for fabricating the same, which can improve a switching characteristic by rounding off an edge part of lower and upper electrodes, which comes in contact with a resistive layer therebetween.

In accordance with an aspect of the present invention, there is provided a resistive memory device including a plurality of resistive units, each resistive unit including: a lower electrode formed over a substrate; a resistive layer formed over the lower electrode; and an upper electrode formed over the resistive layer, wherein edge parts of the lower and upper electrodes, which come in contact with the resistive layer, is formed with a rounding shape.

In accordance with another aspect of the present invention, there is provided a method for fabricating a resistive memory device including forming a lower electrode over a substrate; forming a resistive layer over the lower electrode; forming an upper electrode over the resistive layer; etching the lower electrode, the resistive layer, and the upper electrode to form a resistive unit; and oxidizing sidewalls of the resistive unit.

In accordance with further another aspect of the present invention, there is provided a method for fabricating a resistive memory device including forming a lower electrode which is buried in an insulation layer and has an upper portion protruded above the insulation layer; forming a resistive layer along a profile of the insulation layer and the lower electrode including the protruded upper portion; forming an upper electrode conductive layer over the resistive layer; and etching the upper electrode conductive layer to form an upper electrode.

DESCRIPTION OF SPECIFIC EMBODIMENTS

Figure 1:
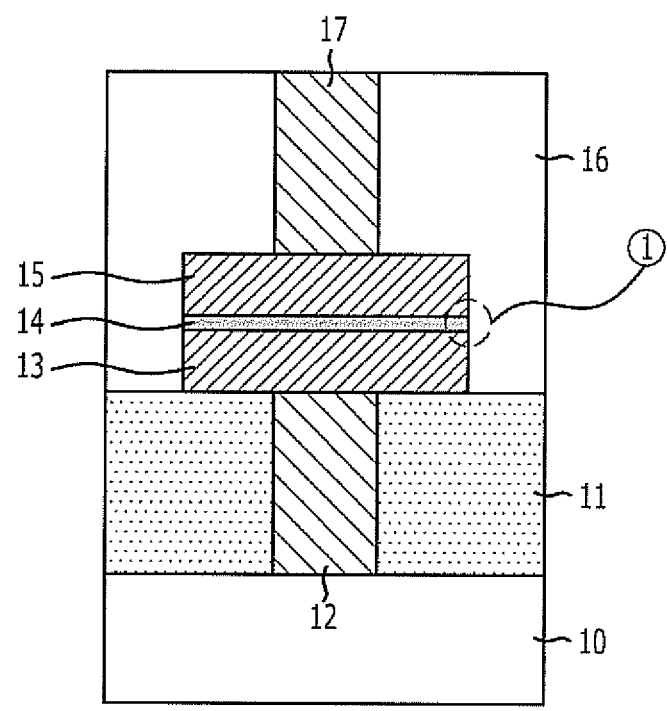
FIG. 1 illustrates a cross-sectional view of a typical resistive memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 2D illustrate cross-sectional views of a resistive memory device to describe a method for fabricating the same in accordance with a first embodiment of the present invention.

Figure 2A:
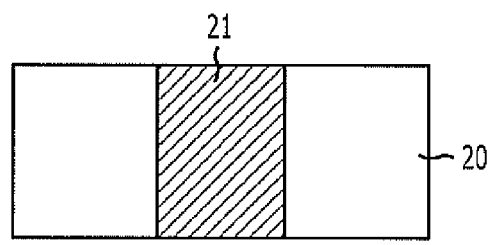
FIGS. 2A to 2D illustrate cross-sectional views of a resistive memory device to describe a method for fabricating the same in accordance with a first embodiment of the present invention.

Referring to FIG. 2A, an insulation layer 20 is formed over a substrate (not shown) having a required predetermined structure formed therein, such as a contact plug. Here, the insulation layer 20 includes a material layer having an excellent characteristic with respect to a leakage current. Preferably, the insulation layer 20 includes a silicon oxide or a silicon nitride.

Subsequently, the insulation layer 20 is etched to form a trench to expose a surface of a lower contact plug in the substrate (not shown). After a conductive layer is formed to fill the trench, a planarization process is performed to expose a surface of the insulation layer 20. As a result, a lower electrode 21 which is buried in the insulation layer 20 is formed.

Figure 2B:
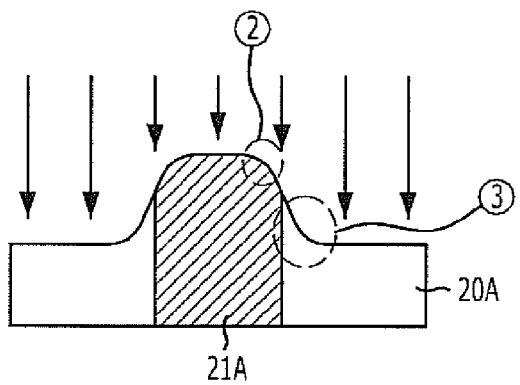

Referring to FIG. 2B, an etch process is performed to protrude an upper portion of the lower electrode 21. The etch process may be performed under conditions that an etch rate of the insulation layer 20 is greater than that of the lower electrode 21. The etch process may be an anisotropic etch process. Under those conditions, the insulation layer 20 is etched first, and then an edge part of the protruded upper portion of the lower electrode 21 is etched. Accordingly, the insulation layer 20 and the lower electrode 21 have a profile of a gentle shape ② as shown in FIG. 2B. That is, during the etch process, the edge part of the protruded upper portion of the lower electrode 21, which has a sharp-pointed shape, is removed to have a profile of a curved line shape, i.e., a rounding shape.

Furthermore, in case of the anisotropic etch process, a predetermined thickness of the insulation layer 20 remains on sidewalls of the exposed upper portion of the lower electrode 21 so that the insulation layer 20 surrounds the sidewalls of the upper portion of the lower electrode 21, as shown in ③ FIG. 2B. Accordingly, an exposed area of the lower electrode 21 may be reduced. In FIG. 2B, a lower electrode whose edge part is rounded off is represented as a reference "21A", and an etched insulation layer is represented as a reference "20A".

Figure 2C:
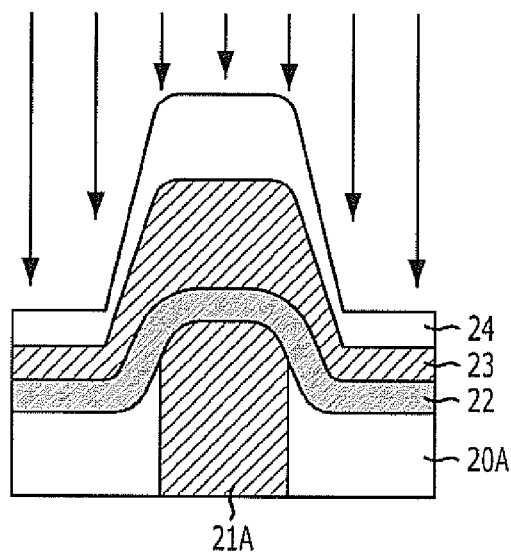

Referring to FIG. 2C, a resistive layer 22 is formed along a surface of the protruded upper portion of the lower electrode 21A and the insulation layer 20A, and an upper electrode conductive layer 23 is formed over the resistive layer 22. Herein, a process for forming the resistive layer 22 is performed with an excellent step coverage characteristic in comparison with a process for forming the upper electrode conductive layer 23. For example, the process for forming the resistive layer 22 may be performed by a chemical vapor deposition (CVD) method or an atomic layer deposition (ALD) method while the process for forming the upper electrode conductive layer 23 may be performed by a plasma method or a vaporization method.

By forming the resistive layer 22 with an excellent step coverage characteristic, the resistive layer 22 is formed with a uniform thickness over the lower electrode 21A along a profile of the protrude upper portion of the lower electrode 21A. Further, by forming the upper electrode conductive layer 23 with relatively poor step coverage characteristic, the upper electrode conductive layer 23 formed over the lower electrode 21A is formed to have a thickness greater than that of the upper electrode conductive layer 23 formed over the insulation layer 20A.

Subsequently, a hard mask layer 24 is formed over the upper electrode conductive layer 23. Here, a process for forming the hard mask layer 24 is performed with a poor step coverage characteristic in comparison with a process for forming the resistive layer 22. By forming the hard mask layer 24 with a poor step coverage characteristic, the hard mask layer 24 formed over the lower electrode 21A is formed to have a thickness greater than that of the hard mask layer 24 formed over the insulation layer 20A.

Subsequently, an anisotropic etch process is performed to etch the upper electrode conductive layer 23 and the hard mask layer 24. In this embodiment, the resistive layer 22 is not etched during the anisotropic etch process. On the contrary, the resistive layer 22 may be etched during the anisotropic etch process in another embodiment. For example, in case of a Phase-change Random Access Memory (PcRAM), the resistive layer 22 is also etched during the anisotropic etch process. On the contrary, in case of a Resistive Random Access Memory (ReRAM), the resistive layer 22 is not etched during the anisotropic etch process.

At this time, as described above, since the upper electrode conductive layer 23 and the hard mask layer 24 formed over the lower electrode 21A are formed to have a thickness greater than that formed over the insulation layer 20A, the upper electrode conductive layer 23 and the hard mask layer 24 are easily etched by using a step difference without an additional mask.

Figure 2D:
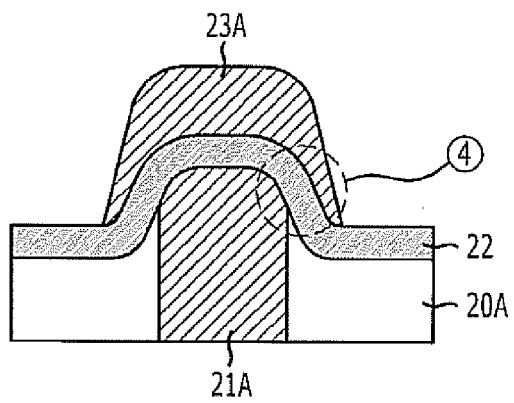

Referring to FIG. 2D, a resistive unit is formed to have the lower electrode 21A, the resistive layer 22 and an upper electrode 23A, whose edge parts are rounded off.

As described above, the first embodiment of the present invention forms the resistive layer 22 after rounding off the edge part of the lower electrode 21A. Accordingly, the edge part of the lower electrode 21A, which comes in contact with the resistive layer 22, is formed with a gentle shape. In other words, while the lower electrode 21A is buried in the insulation layer 20A, the upper portion of the lower electrode 21A is protruded above the insulation layer 20A, and the edge part of the upper portion of the lower electrode 21A is formed with a curved line shape.

Furthermore, the first embodiment of the present invention sequentially forms the resistive layer 22 and the upper electrode 23A along the edge part of the protruded upper portion of the lower electrode 21A, which has a curved line shape. Accordingly, edge parts of upper portions of the resistive layer 22 and the upper electrode 23A are also formed with a curved line shape. That is, since the resistive layer 22 and the upper electrode 23A are formed to surround the protruded upper portion of the lower electrode 21A, the edge parts of the upper portions of the resistive layer 22 and the upper electrode 23A are formed to have a rounding shape.

Furthermore, since the sidewalls of the protruded upper portion of the lower electrode 21A is surrounded by the insulation layer 20A, the upper electrode 23A formed thereon has a width greater than that of the lower electrode 21A.

In a prefer embodiment, the resistive layer 22 between the lower electrode 21A and the upper electrode 23A may be formed to be separated for each resistive unit, or formed to be coupled to each resistive unit. For example, in case where the resistive layer 22 is etched during the anisotropic etch process for etching the upper electrode conductive layer 23 and the hard mask layer 24 shown in FIG. 2C, the resistive layer 22 is formed to be separated for each resistive unit. On the other hand, in case where the resistive layer 22 is not etched during the anisotropic etch process, the resistive layer 22 is formed to be coupled to each resistive unit.

In accordance with the first embodiment of the present invention, an electric field is not concentrated at an edge part of the resistive unit, i.e., ④ as shown in FIG. 2D, in comparison with the conventional resistive unit. As a result, distribution of a sensing current between a core part and an edge part of the resistive unit becomes uniform in the resistive unit, and a switching characteristic of the resistive unit is improved. Further, a leakage current may be prevented at the edge part of the resistive unit, and a sensing margin becomes wider since an on/off ratio of a selection element is improved.

Moreover, since the resistive unit is formed in a such way that the sidewalls of the protruded upper portion of the lower electrode 21A is surrounded by the insulation layer 20A, an effective area of the lower electrode 21A, the resistive layer 22 and the upper electrode 23A may be reduced even if the lower electrode 21A is formed to have a protrusion portion. As a result, a characteristic of the resistive unit is improved.

Figure 3A:
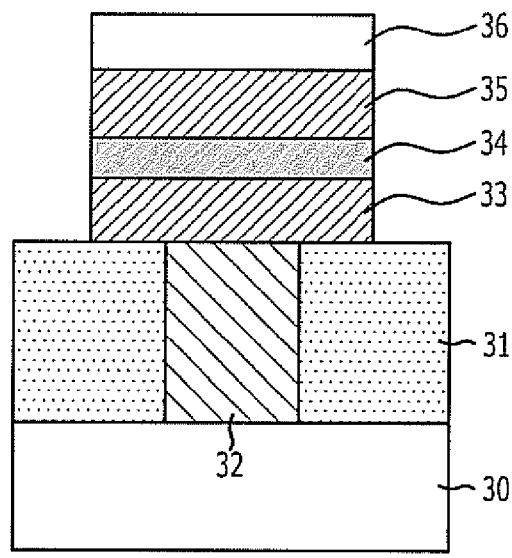
FIGS. 3A to 3B illustrate cross-sectional views of a resistive memory device to describe a method for fabricating the same in accordance with a second embodiment of the present invention.
Figure 3B:
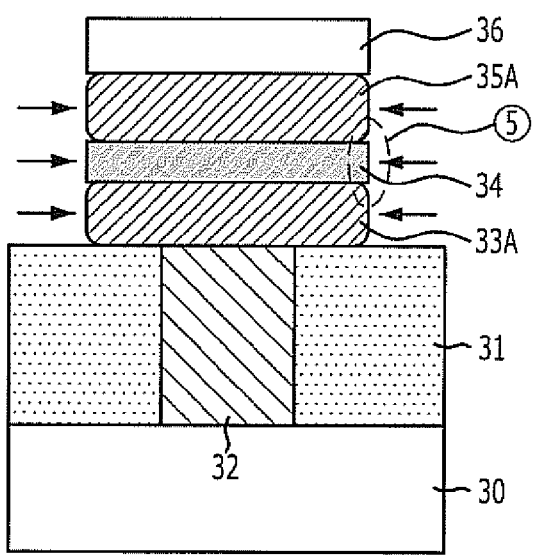

FIGS. 3A to 3B illustrate cross-sectional views of a resistive memory device to describe a method for fabricating the same in accordance with a second embodiment of the present invention.

Referring to FIG. 3A, after an insulation layer 31 is formed over a substrate 30, the insulation layer 31 is etched to form a trench to expose a surface of the substrate 30. By forming a conductive layer to fill the trench, a contact plug 32 which passes through the insulation layer 31 and is connected with the substrate 30 is formed.

Subsequently, a lower electrode 33, a resistive layer 34, and an upper electrode 35 are sequentially formed over the insulation layer 31 and the contact plug 32. Then, a hard mask layer 36 is formed over the upper electrode 35, and all of the lower and upper electrodes 33 and 35, the resistive layer 34, and the hard mask layer 36 are etched. Accordingly, a resistive unit is formed to include the lower electrode 33, the resistive layer 34, and the upper electrode 35, which cover the contact plug 32.

Referring to FIG. 3B, an oxidation process is performed on sidewalls of the resistive unit. Preferably, the oxidation process includes a radical oxidation process.

During the oxidation process, the lower electrode 33 and the upper electrode 35 are oxidized while the resistive layer 34 is not oxidized. As a result, edge parts of the lower electrode 33 and the upper electrode 35 are rounded off. In FIG. 3B, a lower electrode whose edge part is rounded off is represented as a reference "33A", and an upper electrode whose edge part is rounded off is represented as a reference "35A". Each edge part of the lower electrode 33A and the upper electrode 35A, which comes in contact with the resistive layer 34, has a profile of a curved line shape, i.e., a rounding shape ⑤ as shown in FIG. 3B.

Although not shown, after an insulation layer is formed over the resistive unit, a process for forming a contact plug, which passes through the insulation layer and is coupled to the upper electrode 35, may be additionally performed.

In the above-described exemplary embodiments of the present invention, each edge part of lower and upper electrodes, which comes in contact with a resistive layer, has a profile of a curved line shape, i.e., a rounding shape. Accordingly, an electric field is not concentrated at an edge part of a resistive unit. Since distribution of a sensing current between a core part and an edge part of the resistive unit becomes uniform in the resistive unit, a characteristic of the resistive unit can be improved.

Further, exemplary embodiments of the present invention described herein provide advantages in that an on/off ratio of a selection element becomes improved and a sensing margin becomes improved since a leakage current may not be occurred at the edge part of the resistive unit.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a resistive memory device, the method comprising:
   forming a lower electrode in an insulation layer;
   etching the insulation layer so that an upper portion of the lower electrode protrudes above a surface of the insulation layer;
   etching edge parts of the upper portion of the lower electrode to curve the edge parts; and
   etching a portion of the insulation layer near the upper portion of the lower electrode to curvedly slope the portion of the insulation layer, wherein the curvedly-sloped portion of the insulation layer remains on sidewalls of the upper portion of the lower electrode;
   forming a resistive layer along a profile of the insulation layer and the lower electrode;
   forming an upper electrode conductive layer over the resistive layer; and
   etching the upper electrode conductive layer to form an upper electrode.

2. The method of claim 1, further compromising:
   etching a height of the insulation layer to be lower than a height of the lower electrode.

3. The method of claim 1, further comprising:
   etching the insulation layer at a rate greater than an etch rate of the lower electrode, or
   etching the insulation layer and the lower electrode using anisotropic etching.

4. The method of claim 1, wherein the etching the upper electrode conductive layer further comprises:
   etching the upper electrode conductive layer using anisotropic etching.

5. The method of claim 1, further comprising:
   etching the resistive layer during the etching of the upper electrode conductive layer.

6. The method of claim 1, wherein the forming the resistive layer further comprises:
   forming the resistive layer via chemical vapor deposition (CVD) or atomic layer deposition (ALD), and
   the forming the upper electrode conductive layer further comprises:
   forming the upper electrode conductive layer via is performed a plasma method or a vaporization method.

7. The method of claim 1, further comprising:
   forming a hard mask layer over the upper electrode conductive layer.

8. The method of claim 7, wherein the forming the upper electrode further comprises:

anisotropically etching the hard mask layer and the upper electrode conductive layer.

9. The method of claim 8, wherein the forming the resistive layer further comprises:
forming the resistive layer with a higher step coverage than a step coverage of the upper electrode conductive layer or the hard mask layer.

* * * * *